(12) United States Patent
Takeishi et al.

(10) Patent No.: US 6,879,366 B2
(45) Date of Patent: Apr. 12, 2005

(54) SIGNAL PROCESSING CIRCUIT SUBSTRATE USED FOR LIQUID CRYSTAL DISPLAY UNIT AND METHOD OF ASSEMBLING THE SAME

(75) Inventors: Yutaka Takeishi, Tokyo (JP); Ikuo Shiraishi, Hyogo (JP)

(73) Assignee: NEC LCD Technologies, Kanagawa (JP)

( * ) Notice: Subject to any disclaimer, the term of this patent is extended or adjusted under 35 U.S.C. 154(b) by 187 days.

(21) Appl. No.: 09/801,900

(22) Filed: Mar. 9, 2001

(65) Prior Publication Data

US 2001/0020997 A1 Sep. 13, 2001

(30) Foreign Application Priority Data

Mar. 9, 2000 (JP) .......................................... 2000-064532

(51) Int. Cl.[7] .......................................... G02F 1/1345
(52) U.S. Cl. ............................................ 349/149
(58) Field of Search .......................... 349/149, 60, 58, 349/158, 110; 358/236; 267/152; 345/91; 361/748

(56) References Cited

U.S. PATENT DOCUMENTS

| | | | | |
|---|---|---|---|---|
| 4,646,158 A | * | 2/1987 | Ohno et al. ................. | 348/794 |
| 4,699,470 A | * | 10/1987 | McLaughlin et al. ....... | 349/152 |
| 5,703,665 A | * | 12/1997 | Muramatsu et al. .......... | 349/60 |
| 6,292,370 B1 | * | 9/2001 | Anderson et al. ........... | 361/748 |
| 6,316,731 B1 | * | 11/2001 | Goshima ..................... | 174/250 |
| 6,370,766 B1 | * | 4/2002 | Degani et al. ................ | 29/832 |
| 6,409,159 B1 | * | 6/2002 | Asai et al. ................... | 267/152 |
| 2001/0005240 A1 | * | 6/2001 | Takeishi ...................... | 349/58 |

FOREIGN PATENT DOCUMENTS

| | | | | |
|---|---|---|---|---|
| JP | 03116898 | * | 5/1991 | ............ H05K/7/12 |
| JP | 6-214212 | | 8/1994 | |

\* cited by examiner

*Primary Examiner*—Robert H. Kim
*Assistant Examiner*—Jeanne Andrea Di Grazio
(74) *Attorney, Agent, or Firm*—Young & Thompson

(57) ABSTRACT

A signal processing circuit substrate is formed with a through-hole. A device having a variable value and including an value adjustment portion through which the variable value is adjusted is mounted on a first surface of the signal processing circuit substrate. The signal processing circuit substrate includes a flexible arch-shaped member having a height relative to the first surface of the signal processing circuit substrate. The device is electrically and mechanically fixed onto a lower surface of the member in a floating condition above the signal processing circuit substrate such that the value adjustment portion is in alignment with the through-hole so as to allow the value adjustment portion to be adjusted through the through-hole. The member is fixed at opposite edges onto the first surface of the signal processing circuit substrate.

54 Claims, 10 Drawing Sheets

SIGNAL PROCESSING CIRCUIT SUBSTRATE USED FOR LIQUID CRYSTAL DISPLAY UNIT AND METHOD OF ASSEMBLING THE SAME

BACKGROUND OF THE INVENTION

1. Field of the Invention

The invention relates to a signal processing circuit substrate used for a liquid crystal display unit, and more particularly to such a signal processing circuit substrate on which a device such as a resistor is mounted.

2. Description of the Related Art

There has been known a signal processing circuit substrate on which a variable resistor is mounted for optimally adjusting a supplied voltage. For instance, such a signal processing circuit substrate is equipped in a liquid crystal panel constituting a liquid crystal display unit used as a display screen of a personal computer.

FIGS. 1A and 1B illustrate a liquid crystal display panel unit including a conventional signal processing circuit substrate. FIG. 1A includes a plan view, a bottom view and a side view of the liquid crystal display panel unit, and FIG. 1B is a cross-sectional view taken along the line 1B—1B in FIG. 1A.

As illustrated in FIGS. 1A and 1B, a liquid crystal panel unit 1 has an upper surface 1a and a lower surface 1b. A rectangular liquid crystal panel 2 and a frame-shaped shield member 3 covering an outer edge of the liquid crystal panel 2 are arranged on or above the upper surface 1a. First and second signal processing circuit substrates 4a and 4b are arranged on the lower surface 1b along longer and shorter sides, respectively.

As illustrated in FIG. 1B, the shield 3 is in the form of a frame having a reverse L-shaped cross-section. The shield 3 covers an entire outer edge of the liquid crystal panel 2, and defines an outer wall 3a as a sidewall of the liquid crystal panel unit 1. As illustrated in FIG. 1A, the shield 3 is formed with a through-hole 5a. As illustrated in FIG. 1B, the through-hole 5a is open also to the wall 3a.

The first signal processing circuit substrate 4a has an extending portion 4A in alignment with the through-hole 5a.

A light-guide member 7 having a multi-layered structure is formed beneath a lower surface of the liquid crystal panel 2, as illustrated in FIG. 1B. The liquid crystal panel 2 together with the light-guide member 7 is assembled into a frame-shaped back light chassis. A light diffusion sheet 7a entirely covers the light-guide member 7 therewith at a lower surface of the light-guide member 7. The back-light chassis 8 has such a size that an outer edge of the liquid crystal panel 2 is located below the shield 3.

There is a space between an outer wall of the back-light chassis 8 and the wall 3a of the shield 3 below the shield 3 through which the through-hole 5a is formed. A variable resistor 6a used for optimally adjusting a supplied voltage is mounted on the extending portion 4A in the space, as illustrated in FIG. 1B. The variable resistor 6a has a value adjustment portion 6b through which a resistance of the variable resistor 6a can be adjusted. The variable resistor 6a is positioned in the space such that the value adjustment portion 6b faces the through-hole 5a.

Hence, a resistance of the variable resistor 6a can be adjusted by inserting an adjuster such as a screwdriver into the space through the through-hole 5a, and rotating the value adjustment portion 6b by means of the adjuster. Thus, a supplied voltage can be optimized at the side of the first surface 1a of the liquid crystal panel unit 1.

It is necessary to adjust a resistance of the variable resistor 6a in every liquid crystal panel unit 1 such that a supplied voltage is an optimal voltage when a direct current is turned into an alternating current in a liquid crystal display unit driven with an alternating current. If the resistance is not properly adjusted, there is likely to occur flicker, burning or sticking, and non-uniformity in display.

FIGS. 2A to 2C illustrate a liquid crystal panel unit including another conventional signal processing circuit substrate. FIG. 2A includes a front view, a bottom view and a side view of the liquid crystal panel unit, FIG. 2B is a cross-sectional view taken along the line 2B—2B in FIG. 2A, and FIG. 2C is an enlarged view of a portion of the liquid crystal panel unit.

As illustrated in FIG. 2B, a liquid crystal panel unit 9 includes a variable resistor 6d which is mounted on a first signal processing circuit substrate 4c, in place of the variable resistor 6a. The variable resistor 6d includes the value adjustment portion 6b on a top thereof and an additional value adjustment portion 6c at a bottom thereof.

The shield 3 is not formed with a through-hole such as the through-hole 5a, but the first signal processing circuit substrate 4c is formed with a through-hole 5b. The variable resistor 6d is mounted on the first signal processing circuit substrate 4c such that the additional value adjustment portion 6c is located within the through-hole 5b.

The other structures of the liquid crystal panel unit 9 are the same as the structures of the liquid crystal panel unit 1 illustrated in FIGS. 1A and 1B.

Hence, a resistance of the variable resistor 6d can be adjusted by inserting an adjuster such as a screwdriver into the space through the through-hole 5b, and rotating the value adjustment portion 6c by means of the adjuster. Thus, a supplied voltage can be optimized at the side of a second surface 9b of the liquid crystal panel unit 9.

The above-mentioned liquid crystal panel units 1 and 9 are designed to have a small frame and a small thickness in order to be thin and have a broad display area in response to requirements of a small size, a light weight and small power consumption in a personal computer. For instance, the liquid crystal display units 1 and 9 are designed to have a thickness in the range of 6 to 8 mm, and have an effective pixel area occupying about 90% of an area of the panel.

In addition, the liquid crystal panel units 1 and 9 have to be designed such that the value adjustment portions 6b and 6c are exposed through the through-holes 5a and 5b, respectively, because the variable resistors 6a and 6d are adjusted with an operator observing a display screen after the first signal processing circuit substrates 4a and 4c have been mounted on the liquid crystal panel 2.

The variable resistor 6a which is adjusted at the side of the first surface 1a of the liquid crystal panel unit 1 has a height of about 1 mm, and is lower than the variable resistor 6d which is adjusted at the side of the second surface 9a of the liquid crystal panel unit 9 and has a height of about 1.5 mm. Accordingly, the variable resistor 6a is more appropriate for reduction in a height of a liquid crystal panel unit. However, as illustrated in FIG. 1B, it is necessary to form the through-hole 5a throughout the shield 3.

In the liquid crystal display panel 9, a space between the liquid crystal panel 2 and the light-guide member 7 is smaller than 1.5 mm at a central area of the first signal processing circuit substrate 4c. Hence, the variable resistor 6c cannot be positioned in the central area of the first signal processing circuit substrate 4c, and accordingly, has to be positioned in a marginal area of the first signal processing circuit substrate 4c in which a sufficiently broad space can be ensured.

In addition, it is unavoidable that the shield 3 formed with the through-hole 5a would have a reduced mechanical strength.

Furthermore, if the variable resistor is mounted on the signal processing circuit substrate in a marginal area thereof, the back-light chassis 8 has to be formed thin in order to ensure a sufficient space for mounting the variable resistor therein in a limited space inside the shield 3. As a result, it is unavoidable that a mechanical strength of the back-light chassis 8 is reduced. This is quite severe condition for the shield 3 which is formed as narrow as possible in order to form an effective pixel area as wide as possible.

A space between the first signal processing circuit substrate 4a, 4c and the light guide 7 is almost in its limit. If the space were formed greater, the liquid crystal panel 2 has to be formed thinner, resulting in that it would be impossible to ensure requisite functions of the liquid crystal panel 2. Hence, it is quite difficult to form the space greater.

Since the value adjustment portion 6c of the variable resistor 6d is exposed through the through-hole 5b formed through the signal processing circuit substrate 4c, an adjuster such as a screwdriver could be readily engaged to the value adjustment portion 6c. On the other hand, since the value adjustment portion 6b of the variable resistor 6a is much spaced away from the through-hole 5a, an operator has to look for the value adjustment portion 6b with an adjuster after inserting the adjuster through the through-hole 5a. As a result, an operator may damage the variable resistor 6a with the adjuster.

Thus, in the above-mentioned conventional liquid crystal panel units 1 and 9, the variable resistors 6a and 6d have to be positioned in a limited area, and the variable resistors 6a and 6d may be damaged in assembling the liquid crystal panel units 1 and 9, due to reduction in a mechanical strength.

In the above-mentioned liquid crystal panel units 1 and 9, the variable resistors 6a and 6d are explained as examples, but the same problems as mentioned above are caused when other devices such as a capacitor are to be mounted on a signal processing circuit substrate.

SUMMARY OF THE INVENTION

In view of the above-mentioned problems in the conventional signal processing circuit substrates, it is an object of the present invention to provide a signal processing circuit substrate which is capable of positioning a device without limitation with respect to an area in which the device is to be mounted, and avoiding reduction in a mechanical strength of a device to thereby avoid the device from being damaged in assembling.

In one aspect of the present invention, there is provided a signal processing circuit substrate used for a liquid crystal display unit, a device being mounted on a first surface of the signal processing circuit substrate, the device having a variable value and including an value adjustment portion through which the variable value is adjusted, the signal processing circuit substrate including a mounting member to which the device is electrically and mechanically connected such that the value adjustment portion faces a through-hole formed throughout the signal processing circuit substrate, the mounting member being fixed at opposite thereof onto the first surface of the signal processing circuit substrate.

For instance, the mounting member may be comprised of a flexible printed circuit.

It is preferable that the mounting member is composed of flexible material, and the device is supported by the mounting member in a floating condition above the signal processing circuit substrate.

It is preferable that the mounting member is fixed at one corner thereof onto the first surface of the signal processing circuit substrate and fixed together with terminals of the device at three corners thereof onto the first surface of the signal processing circuit substrate.

It is preferable that the device is mounted on the mounting member such that the value adjustment portion does not project beyond a second surface of the signal processing circuit substrate.

It is preferable that the through-hole has such an area that an adjuster used for adjusting the value adjustment portion can move sufficiently to be engaged with the value adjustment portion through the through-hole.

It is preferable that the area is equal to a sum of a first area actually occupied by the device and a second area in which the device is allowed to move.

The signal processing circuit substrate may further include a plate for reinforcing the mounting member which plate absorbs a compressive force exerted on the mounting member when the value adjustment portion is adjusted.

It is preferable that the plate is fixed onto the mounting member at the opposite side of the device.

The signal processing circuit substrate may further include a plurality of reinforcing pads which fix the mounting member onto the first surface of the signal processing circuit substrate.

It is preferable that the signal processing circuit substrate includes at least two reinforcing pads which are located on a diagonal line passing through a center of the mounting member.

It is preferable that the mounting member is formed with a device for preventing the mounting member from being wrongly fixed onto the signal processing circuit substrate.

It is preferable that the device is comprised of three holes which are located in no rotational symmetry about a center of the mounting member.

It is preferable that the device is comprised of three projections which are located in no rotational symmetry about a center of the mounting member.

It is preferable that the means is comprised of three marks which are located in no rotational symmetry about a center of the mounting member.

It is preferable that the mounting member is fixed onto the first surface of the signal processing circuit substrate by any one or more of soldering, application of an adhesive, screwing and welding.

For instance, the device may be a resistor, a capacitor or a laser trimming resistor.

There is further provided a signal processing circuit substrate used for a liquid crystal display unit, a device being mounted on a first surface of the signal processing circuit substrate, the device having a variable value and including an value adjustment portion through which the variable value is adjusted, the signal processing circuit substrate being formed with a through-hole, the signal processing circuit substrate including a flexible arch-shaped member having a height relative to the first surface of the signal processing circuit substrate, the device being electrically and mechanically fixed onto a lower surface of the member in a floating condition above the signal processing circuit substrate such that the value adjustment portion is in alignment with the through-hole so as to allow the value adjustment portion to be adjusted through the through-hole, the member being fixed at opposite edges onto the first surface of the signal processing circuit substrate.

For instance, the member may be comprised of a flexible printed circuit.

It is preferable that the member is fixed at one corner thereof onto the first surface of the signal processing circuit substrate and fixed together with terminals of the device at three corners thereof onto the first surface of the signal processing circuit substrate.

It is preferable that the device is mounted on the member such that the value adjustment portion does not project beyond a second surface of the signal processing circuit substrate.

It is preferable that the through-hole has such an area that an adjuster used for adjusting the value adjustment portion can move sufficiently to be engaged with the value adjustment portion through the through-hole.

It is preferable that the area is equal to a sum of a first area actually occupied by the device and a second area in which the device is allowed to move.

The signal processing circuit substrate may further include a plate for reinforcing the member which plate absorbs a compressive force exerted on the member when the value adjustment portion is adjusted.

It is preferable that the plate is fixed onto the member at the opposite side of the device.

The signal processing circuit substrate may further include a plurality of reinforcing pads which fix the member onto the first surface of the signal processing circuit substrate.

It is preferable that the signal processing circuit substrate includes at least two reinforcing pads which are located on a diagonal line passing through a center of the member.

It is preferable that the reinforcing pads are located adjacent to a bending of the member.

It is preferable that the signal processing circuit substrate includes four reinforcing pads located in a rotational symmetry about a center of the member and adjacent to a bending of the member.

It is preferable that the member is formed with means for preventing the member from being wrongly fixed onto the signal processing circuit substrate.

It is preferable that the means is comprised of three holes which are located in no rotational symmetry about a center of the member.

It is preferable that the means is comprised of three projections which are located in no rotational symmetry about a center of the member.

It is preferable that the means is comprised of three marks which are located in no rotational symmetry about a center of the member.

It is preferable that the member is fixed onto the first surface of the signal processing circuit substrate by any one or more of soldering, application of an adhesive, screwing and welding.

In another aspect of the present invention, there is provided a method of fabricating a signal processing circuit substrate used for a liquid crystal display unit, a device being mounted on a first surface of the signal processing circuit substrate, the device having a variable value and including an value adjustment portion through which the variable value is adjusted, the method including the steps of (a) mounting the device onto an upper surface of a flexible member such that the value adjustment portion upwardly faces, (b) bending the flexible member at first lines thereof towards the lower surface, (c) bending the flexible member at second lines towards the upper surface, the second lines being located between the device and the first lines, and (d) fixing the flexible member at its opposite ends onto the first surface of the signal processing circuit substrate such that the value adjustment portion is exposed through a through-hole formed through the signal processing circuit substrate.

The method may further include the step of (e) fixing a reinforcing plate onto a lower surface of the flexible member, the step (e) being carried out before the step (d).

It is preferable that the flexible member is fixed at one corner thereof onto the first surface of the signal processing circuit substrate and fixed together with terminals of the device at three corners thereof onto the first surface of the signal processing circuit substrate in the step (d).

It is preferable that the flexible member is fixed onto the first surface of the signal processing circuit substrate such that the value adjustment portion does not project beyond a second surface of the signal processing circuit substrate.

The method may further include the step of (f) fixing the flexible member onto the first surface of the signal processing circuit substrate with a plurality of reinforcing pads.

It is preferable that at least two reinforcing pads are located on a diagonal line passing through a center of the member, in the step (f).

It is preferable that four reinforcing pads are located in a rotational symmetry about a center of the member and adjacent to a bending of the flexible member, in the step (f).

There is further provided a method of fabricating a signal processing circuit substrate used for a liquid crystal display unit, a device being mounted on a first surface of the signal processing circuit substrate, the device having a variable value and including an value adjustment portion through which the variable value is adjusted, the method including the steps of (a) patterning a flexible printed circuit sheet into patterns which will make flexible printed circuits, (b) covering the flexible printed circuit sheet with an electrical insulator, (c) mounting the device on a second surface of the flexible printed circuit sheet, (d) cutting the flexible printed circuit sheet into flexible printed circuits, (e) downwardly bending the flexible printed circuit sheet at first lines across the device, (f) upwardly bending the flexible printed circuit sheet at second lines across the device, the second lines being located between the device and the first lines, and (g) fixing the flexible printed circuit sheet onto the first surface of the signal processing circuit substrate such that the value adjustment portion of the device is in alignment with a through-hole formed throughout the signal processing circuit substrate.

The method may further include the step of (h) adhering a reinforcing plate on a first surface of the flexible printed circuit sheet across a width of the flexible printed circuit sheet, the step (h) being carried out prior to the step (d).

The method may further include the step of (i) forming marks located in no rotational symmetry about a center of the printed circuit sheet.

It is preferable that the marks are comprised of holes, and the step (i) is carried out concurrently with the step (d).

It is preferable that the flexible printed circuit is fixed onto the first surface of the signal processing circuit substrate such that the value adjustment portion does not project beyond a second surface of the signal processing circuit substrate.

The method may further include the step of fixing the flexible printed circuit onto the first surface of the signal processing circuit substrate with a plurality of reinforcing pads.

It is preferable that at least two reinforcing pads are located on a diagonal line passing through a center of the flexible printed circuit.

It is preferable that four reinforcing pads are located in a rotational symmetry about a center of the flexible printed circuit and adjacent to the second lines of the flexible printed circuit.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1A:
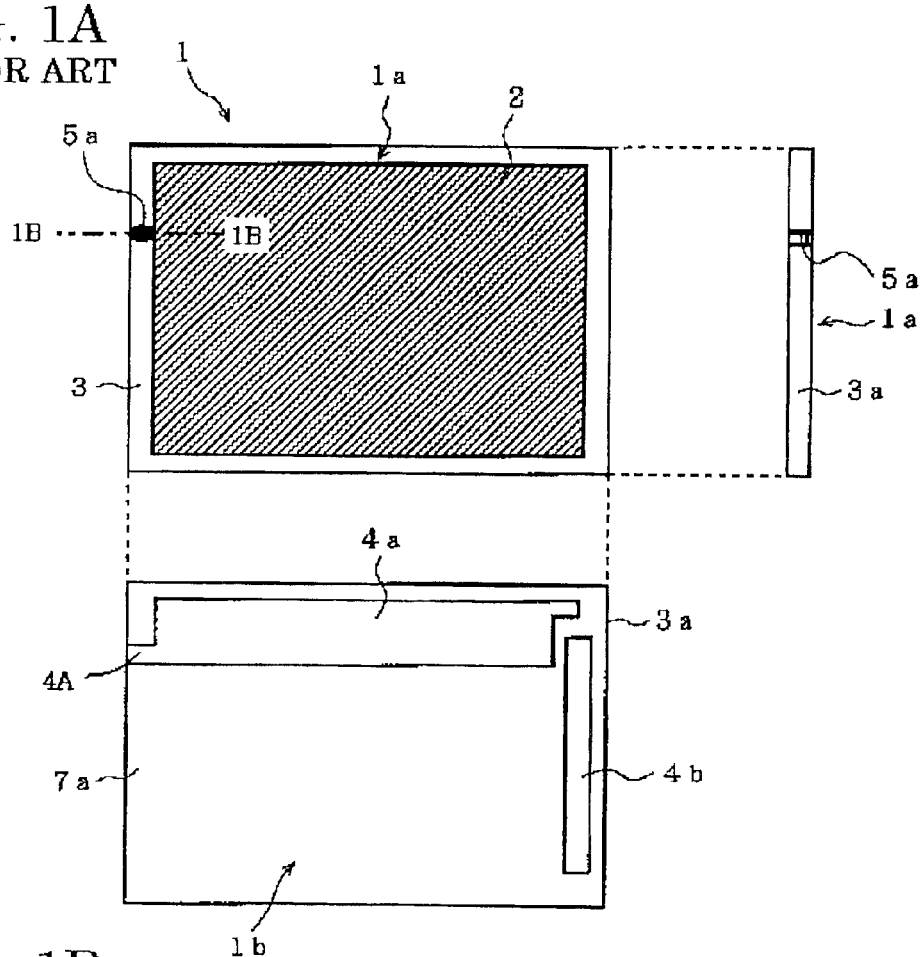
FIG. 1A includes a front view, a bottom view and a side view of a liquid crystal panel unit including a conventional signal processing circuit substrate.
Figure 1B:
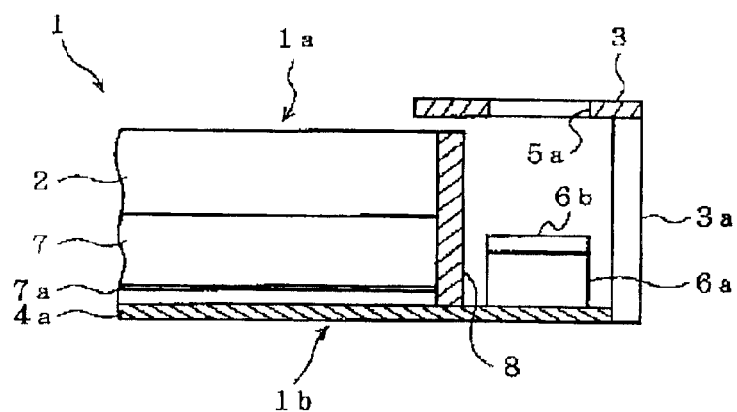
FIG. 1B is a cross-sectional view taken along the line 1B—1B in FIG. 1A.
Figure 2A:
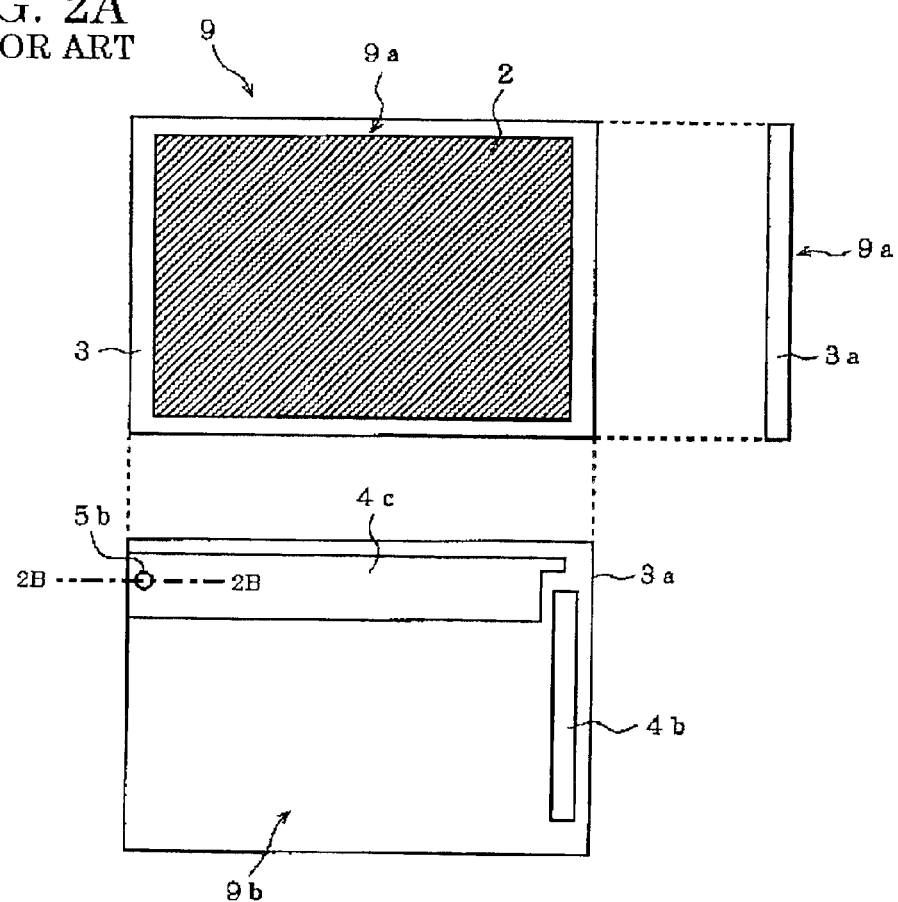
FIG. 2A includes a front view, a bottom view and a side view of a liquid crystal panel unit including another conventional signal processing circuit substrate.
Figure 2B:
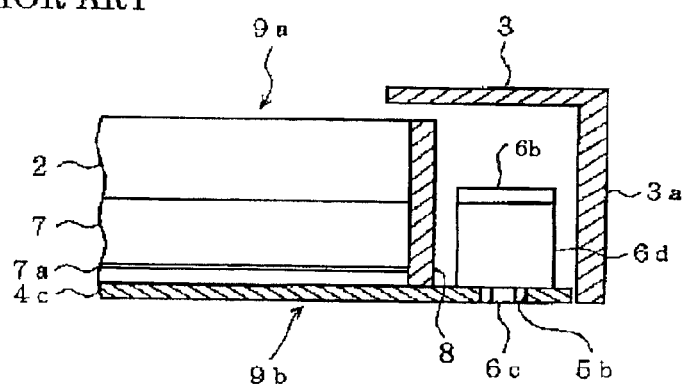
FIG. 2B is a cross-sectional view taken along the line 2B—2B in FIG. 2A.
Figure 2C:
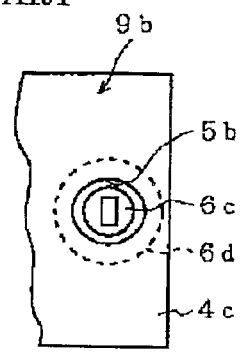
FIG. 2C is an enlarged view of a portion of the liquid crystal panel unit illustrated in FIGS. 2A and 2B.
Figure 3:
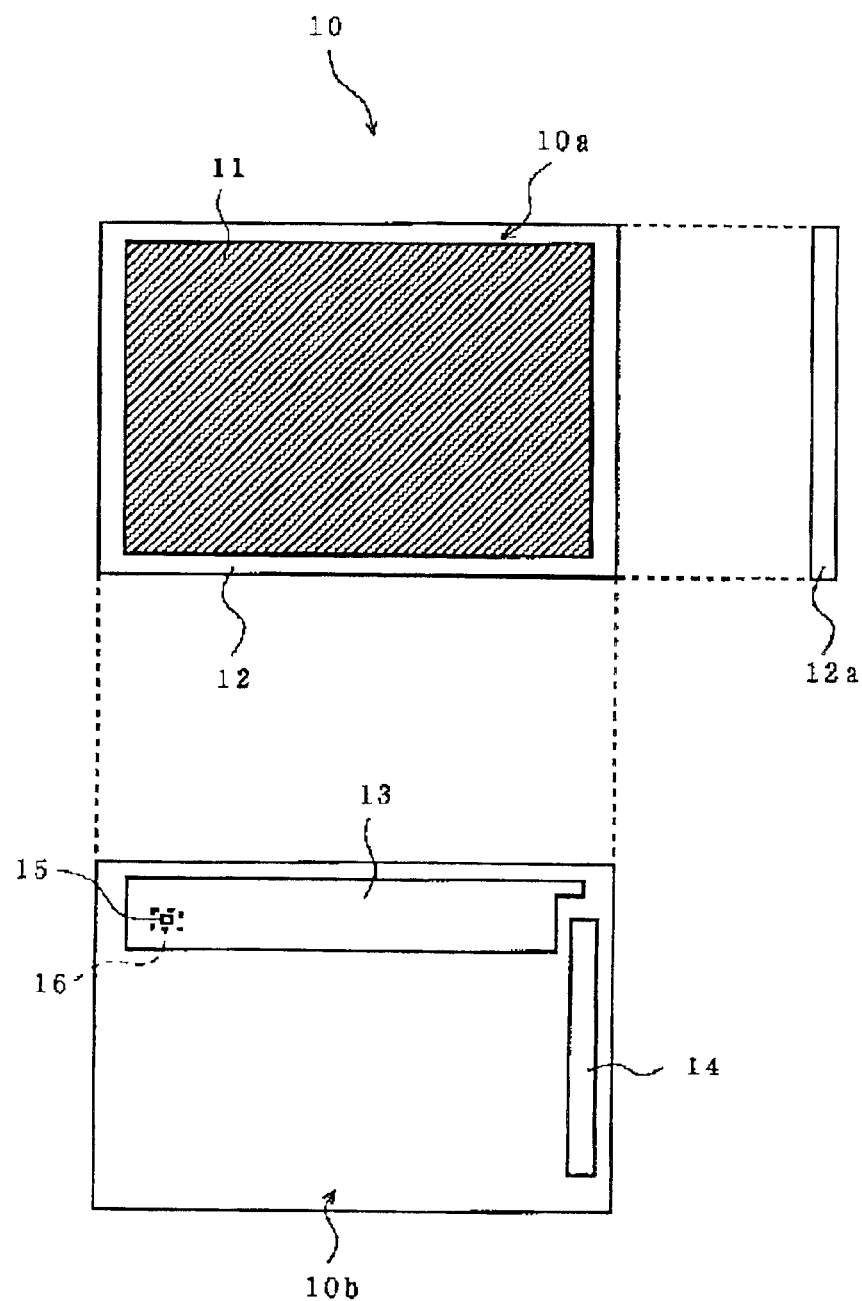
FIG. 3 includes a front view, a bottom view and a side view of a liquid crystal panel unit including a signal processing circuit substrate in accordance with an embodiment of the present invention.

FIG. 3 includes a front view, a bottom view and a side view of a liquid crystal panel unit including a signal processing circuit substrate in accordance with a preferred embodiment of the present invention.

As illustrated, a liquid crystal panel unit 10 includes a rectangular liquid crystal panel 11 and a frame-shaped shield member 12 covering an outer edge of the liquid crystal panel 11, both on an upper surface 10a, and first and second signal processing circuit substrates 13 and 14 on a lower surface 10b.

The liquid crystal panel unit 10 is designed to be thin and to have a wide display area in response to requirements of a small size, a light weight and small power consumption in a personal computer in which a liquid crystal display unit is used. For instance, the liquid crystal panel unit 10 has a thickness of about 4 to 8 mm, and has an effective pixel area which occupies about 90% of a panel.

The shield 12 is in the form of a frame having a L-shaped cross-section, and is composed of a metal plate. The shield 12 includes a standing wall 12a surrounding the liquid crystal panel 11 and defining a sidewall of the liquid crystal panel unit 10.

A variable resistor 15 is mounted on the first signal processing circuit substrate 13 through a flexible printed circuit 16. The variable resistor 15 includes a resistance adjustment portion 15a (see FIG. 5B). By rotating the resistance adjustment portion 15a with an adjuster such as a screwdriver, a resistance of the variable resistor 15 can be adjusted for optimally adjusting a supplied voltage. As mentioned later, the variable resistor 15 is mounted on the first signal processing circuit substrate 13 such that the resistance adjustment portion 15b is exposed through a through-hole 31 (see FIG. 5B) formed throughout the first signal processing circuit substrate 13.

Figure 4:
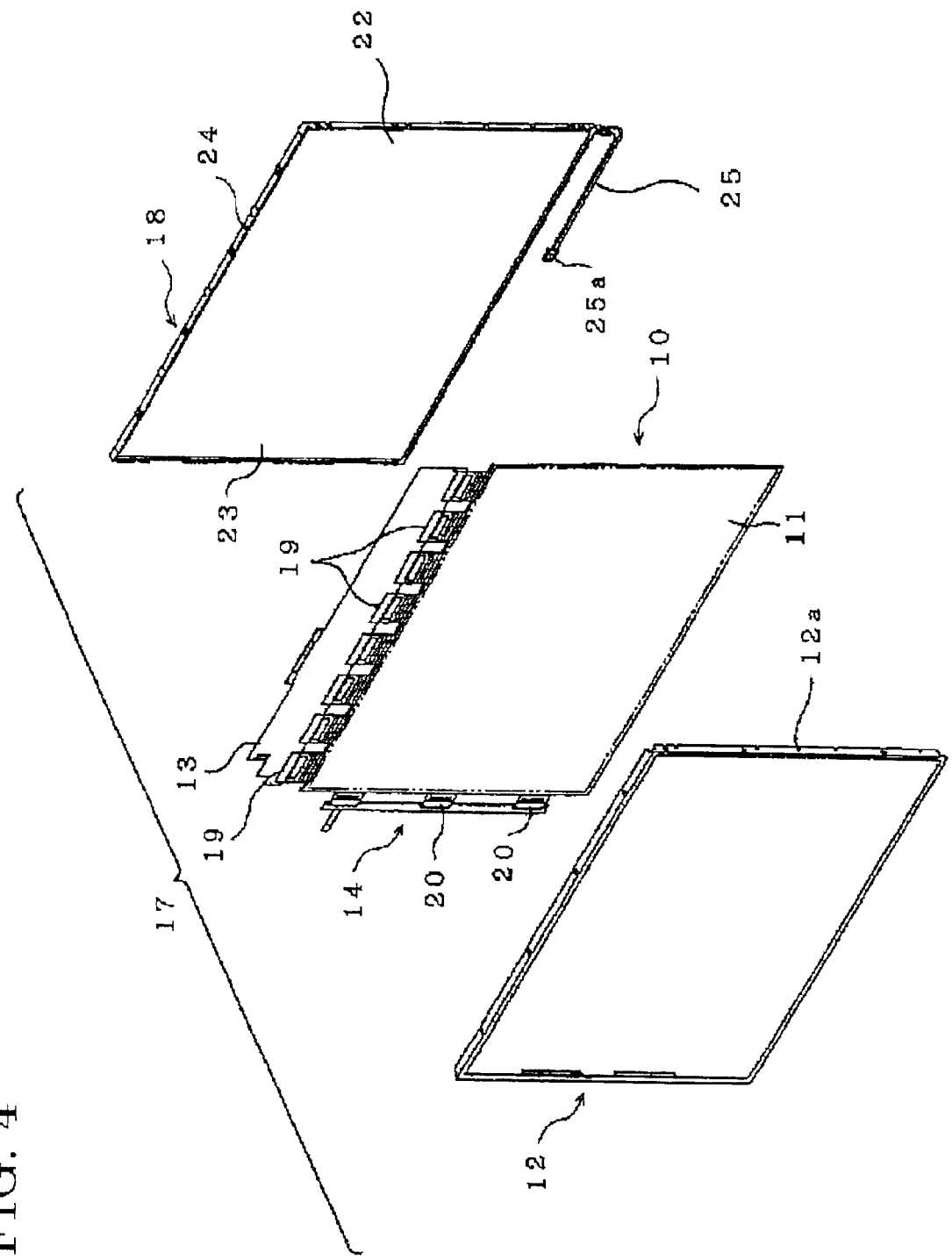
FIG. 4 is an exploded perspective view of a liquid crystal module including the liquid crystal panel illustrated in FIG. 3.

FIG. 4 is an exploded perspective view of a liquid crystal module including the liquid crystal panel illustrated in FIG. 3.

As illustrated in FIG. 4, a liquid crystal module 17 is comprised of the above-mentioned liquid crystal unit 10, the above-mentioned shield 12, and a back-light unit 18. The liquid crystal panel unit 10 is integrally sandwiched between the shield 12 and the back-light unit 18.

The first signal processing circuit substrate (source substrate) 13 is attached to the liquid crystal panel 11 at a longer side, and the second signal processing circuit substrate (gate substrate) 14 is attached to the liquid crystal panel 11 at a shorter side. A plurality of tape carrier packages (TCP) 19 each constituting a driver integrated circuit is attached to the first signal processing circuit substrates 13 at its longer side, and a plurality of tape carrier packages (TCP) 20 each constituting a driver integrated circuit is attached to the second signal processing circuit substrates 14 at its longer side.

The first and second signal processing circuit substrates 13 and 14 are connected to the liquid crystal panel 11 through the tape carrier packages 19 and 20, respectively. The first and second signal processing circuit substrates 13 and 14 can be folded onto the liquid crystal panel 11 through the tape carrier packages 19 and 20, respectively.

The back-light unit 18 is comprised of a light-guide plate 22, a plurality of light diffusion sheets 23 and a back-light mold 24, and is rectangular in shape. The back-light unit 18 includes a lamp (not illustrated) at a lower end of the light-guide plate 22, and a lamp cable 25 extends from the lower end of the light-guide plate 22. The lamp cable 25 has a connector 25a at a distal end thereof. The light-guide plate 22 and the light diffusion sheet 23 are layered one on another, and integrally fixed to each other at their outer edges through the back-light mold 24.

The shield 12 covering the back-light mold 24 therewith defines an outer edge of the liquid crystal module 17. The light-guide plate 22 has a thickness gradually increasing from an upper end to a lower end. Hence, there is formed a small space between an upper portion of the light-guide plate 22 and the first signal processing circuit substrate 13. The space is constant by virtue of a thickness of the back-light mold 24 entering an upper portion of the space.

The tape carrier packages 19 have distal ends which are arranged in a curve along an outer edge of the back-light mold 24, and which are electrically connected to a thin film transistor (TFT) substrate of the liquid crystal panel 11.

Figure 5A:
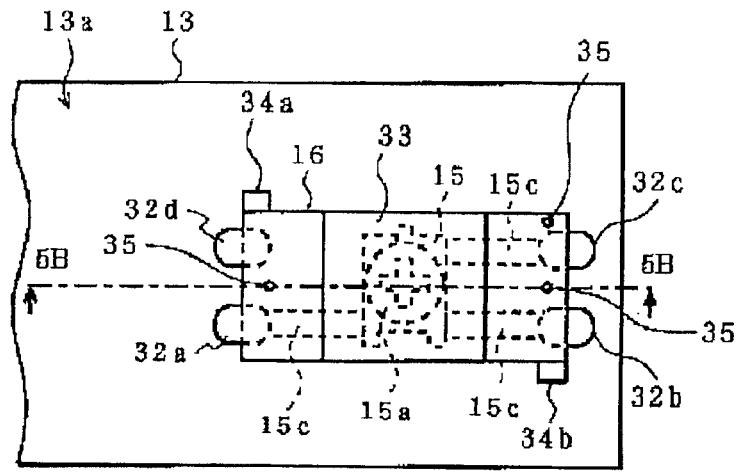
FIG. 5A is a partial plan view of a signal processing circuit substrate in accordance with an embodiment of the present invention.
Figure 5B:
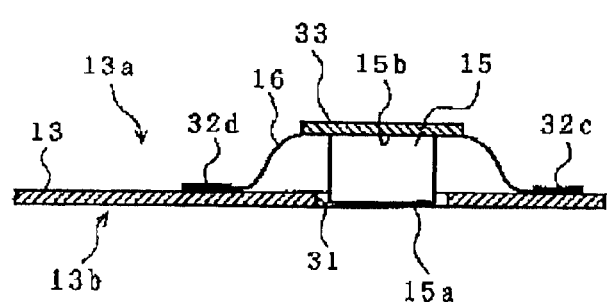
FIG. 5B is a cross-sectional view taken along the line 5B—5B in FIG. 5A.
Figure 5C:
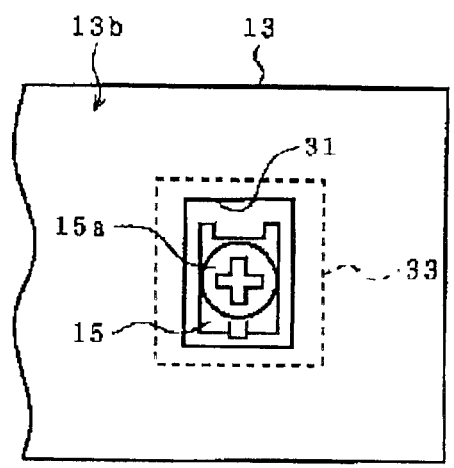
FIG. 5C is a bottom view of the signal processing circuit substrate illustrated in FIG. 5A.

FIGS. 5A to 5C illustrate a part of the first signal processing circuit substrate 13 on which a variable resistor is mounted. FIG. 5A is a plan view, FIG. 5B is a cross-sectional view taken along the line 5B—5B in FIG. 5A, and FIG. 5C is a bottom view of the first signal processing circuit substrate 13.

As illustrated in FIGS. 5A and 5B, a variable resistor 15 is mounted on a first surface 13a of the first signal processing circuit substrate 13, and the first signal processing circuit substrate 13 is formed with a rectangular through-hole 31 in alignment with the variable resistor 15.

As mentioned earlier, the variable resistor 15 includes the resistance adjustment portion 15. The rectangular through-hole 31 is designed to have such a smallest area that an adjuster used for adjusting the value adjustment portion 15 can move sufficiently to be engaged with the value adjustment portion 15 through the through-hole 31, in order to prevent the variable resistor 15 from being damaged during adjusted with an adjuster such as a screwdriver and from making contact with the first signal processing circuit substrate 13.

For instance, the rectangular through-hole 31 has an area equal to a sum of an area actually occupied by the variable resistor 15 and an area in which the variable resistor 15a is allowed to move.

As illustrated in FIG. 5B, the variable resistor 15 is mounted not directly on the first signal processing circuit substrate 13, but through the flexible printed circuit 16 such that the variable resistor 15 is in a floating condition relative to the first signal processing circuit substrate 13. The flexible printed circuit 16 has flexibility to a stress applied thereto, and hence, absorbs such a stress therein. The variable resistor 15 is mounted on the flexible printed circuit 16 such that the resistance adjustment portion 15a is exposed through the through-hole 31, as illustrated in FIGS. 5B and 5C.

The variable resistor 15 is fixed at its surface 15b opposite to the resistance adjustment portion 15a, centrally onto the flexible printed circuit 16 which is broader than the surface 15b of the variable resistor 15. For instance, the variable resistor 15 may be soldered to the flexible printed circuit 16 through a pad or pads.

The flexible printed circuit 16 is fixedly soldered at four corners thereof onto the first surface 13a of the first signal processing circuit substrate 13 through solders 32a to 32d such that the flexible printed circuit 16 entirely covers the rectangular through-hole 31 therewith.

The variable resistor 15 has three connection terminals 15c. These connection terminals 15c are soldered together with the flexible printed circuit 16 onto the first signal processing circuit substrate 13 through the solders 32a to 32c.

The solders 32a and 32d are equally spaced away from a center of a shorter side of the flexible printed circuit 16, and the solders 32b and 32c are equally spaced away from a center of another shorter side of the flexible printed circuit 16. That is, the flexible printed circuit 16 are fixed onto the first surface 13a of the first signal processing circuit substrate 13 through the four solders 32a to 32d which are located in symmetry about a center of the flexible printed circuit 16.

When the flexible printed circuit 16 is fixed onto the first signal processing circuit substrate 13 through the solders 32a to 32d, the flexible printed circuit 16 is formed such that the resistance adjustment portion 15a does not project beyond a lower surface of the first signal processing circuit substrate 13.

Thus, the flexible printed circuit 16 formed in a curve supports the variable resistor 15 in a floating condition relative to the first signal processing circuit substrate 13 such that the resistance adjustment portion 15a is exposed through the rectangular through-hole 31 and that the resistance adjustment portion 15a does not project beyond the first signal processing circuit substrate 13.

The flexible printed circuit 16 is comprised of a thin plate which can be readily bent. Since the flexible printed circuit 16 can be formed in a single step, the number of steps for assembling the liquid crystal panel unit 10 can be reduced.

Thus, the flexible printed circuit 16 connects the variable resistor 15 not only electrically but also mechanically to the first signal processing circuit substrate 13, and defines a height of the variable resistor 15 relative to the first signal processing circuit substrate 13, and can reduce a thickness of the liquid crystal panel unit 10 including the first signal processing circuit substrate 13.

As illustrated in FIGS. 5A and 5B, a reinforcing plate 33 is fixed to the flexible printed circuit 16 in alignment with the variable resistor 15 at the opposite side of the variable resistor 15. The reinforcing plate 33 is composed of the same material as a material of which the first signal processing circuit substrate 13 is composed, and has an area which is broader than the surface 15b of the variable resistor 15, but does not extend beyond the flexible printed circuit 16.

The reinforcing plate 33 absorbs a rotational compressive force exerted on the flexible printed circuit 16 when the resistance adjustment portion 15a is adjusted, to thereby prevent the flexible printed circuit 16 from being damaged.

For instance, the reinforcing plate 33 may be composed of glass and epoxy resin, polyethylene terephthalate (PET) or acrylic resin.

Reinforcing pads 34a and 34b fix the flexible printed circuit 16 onto the first signal processing circuit substrate 13 at two corners of the first signal processing circuit substrate 13 on a diagonal line passing through a center of the first signal processing circuit substrate 13. The reinforcing pads 34a and 34b prevents the flexible printed circuit 16 from peeling off the first signal processing circuit substrate 13, and absorbs a rotational force exerted on the flexible printed circuit 16 when the resistance adjustment portion 15b is adjusted.

The reinforcing pads 34a and 34b may be fixed onto the first signal processing circuit substrate 13, for instance, by soldering, application of an adhesive, welding or screwing alone or in combination.

The flexible printed circuit 16 is designed to have three holes 35 located in no rotational symmetry about a center of the flexible printed circuit 16 for preventing the flexible printed circuit 16 from being wrongly positioned relative to the first signal processing circuit substrate 13.

Since the flexible printed circuit 16 is symmetrical in a length-wise direction, the flexible printed circuit 16 might be positioned oppositely in a length-wise direction. However, by checking a positional relation among the holes 35, it would be possible to prevent the flexible printed circuit 16 from being wrongly positioned, when the flexible printed circuit 16 is fixed onto the first signal processing circuit substrate 13.

The flexible printed circuit 16 may be designed to include a reference mark or a projection such as a hook, in place of the holes 35.

Figure 6A:
FIGS. 6A to 6F are cross-sectional views of a signal processing circuit substrate, illustrating respective step of a method of mounting a variable resistor on the signal processing circuit substrate illustrated in FIGS. 5A to 5C.
Figure 6B:
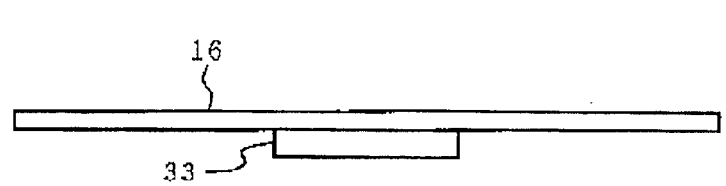

FIGS. 6A and 6B are cross-sectional views of the flexible printed circuit 16, illustrating respective steps of a method of mounting the variable resistor on the first signal processing circuit substrate 13.

FIG. 6A illustrates the flexible printed circuit 16. First, as illustrated in FIG. 6B, the reinforcing plate 33 is fixed onto a lower surface of the flexible printed circuit 16.

Figure 6C:
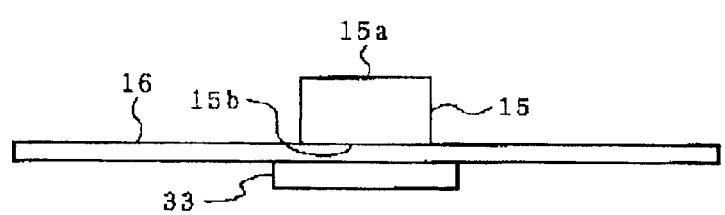

Then, as illustrated in FIG. 6C, the variable resistor 15 is mounted on an upper surface of the flexible printed circuit 16 such that the resistance adjustment portion 15b faces upwardly.

Figure 6D:
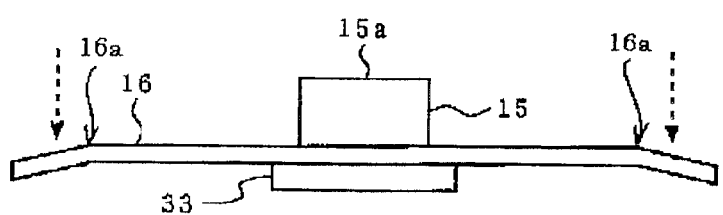

Then, as illustrated in FIG. 6D, the flexible printed circuit 16 is downwardly bent at first lines 16a in the vicinity of opposite ends.

Figure 6E:
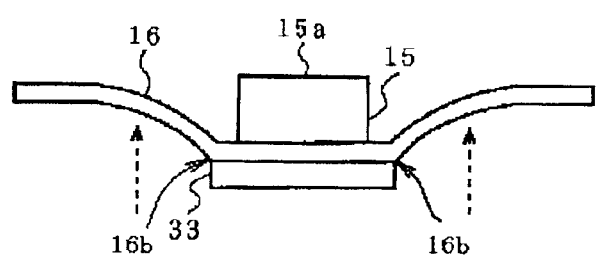

Then, as illustrated in FIG. 6E, the flexible printed circuit 16 is upwardly bent at second lines 16b in the vicinity of the variable resistor 15 such that opposite ends of the flexible printed circuit 16 is located almost the same level as or slightly lower than the resistance adjustment portion 15a.

Figure 6F:
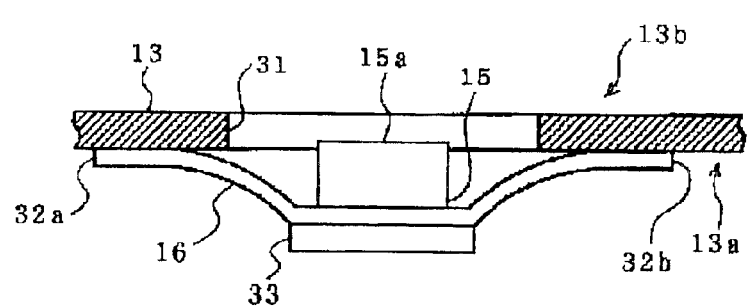

Then, as illustrated in FIG. 6F, the flexible printed circuit 16 is fixed at the opposite ends thereof onto the first surface 13a of the first signal processing circuit substrate 13 through the solders 32a to 32c such that the resistance adjustment portion 15a is exposed through the through-hole 31 and does not project beyond the surface 13b of the first signal processing circuit substrate 13.

FIGS. 7A to 7E are plan views of the flexible printed circuit 16, illustrating respective steps of a method of mounting the variable resistor 15 on the first signal processing circuit substrate 13.

Figure 7A:
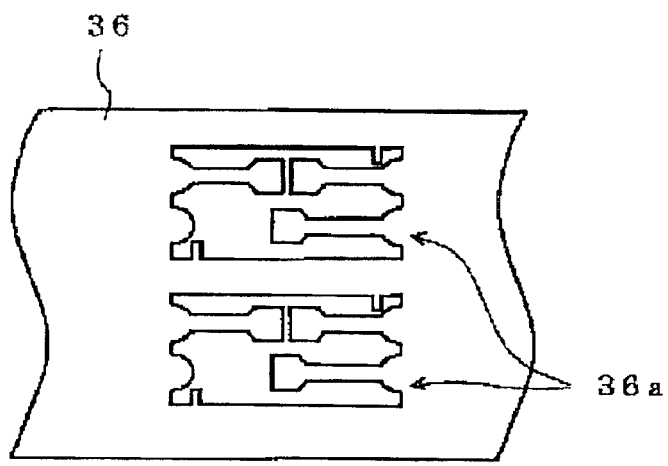
FIGS. 7A to 7E are plan views of a signal processing circuit substrate, illustrating respective step of a method of mounting a variable resistor on the signal processing circuit substrate illustrated in FIGS. 5A to 5C.

First, as illustrated in FIG. 7A, a flexible printed circuit sheet 36 is patterned to define a copper pattern 36a which will make the flexible printed circuit 16, and then, is covered with polyimide except areas where three pads for mounting the variable resistor 15 on the first signal processing circuit substrate 13 are located, and the solders 32a to 32d and the reinforcing pads 34a and 34b are located.

Figure 7B:
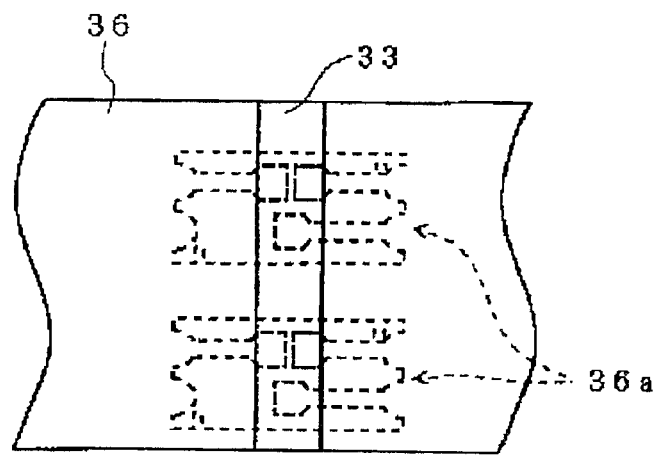

Then, as illustrated in FIG. 7B, the reinforcing plate 33 is adhered to a lower surface of the flexible printed circuit sheet 36 across a width of the flexible printed circuit sheet 36.

Figure 7C:
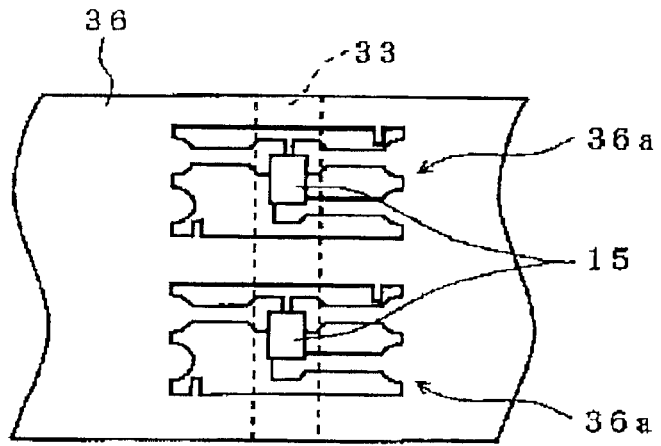

Then, as illustrated in FIG. 7C, the variable resistors 15 are fixed onto an upper surface of the flexible printed circuit sheet 36, for instance, by soldering.

Then, the flexible printed circuit sheet 36 is cut into the flexible printed circuits 16. At the same time, each of the flexible printed circuits 16 is formed with the holes 35.

Figure 7D:
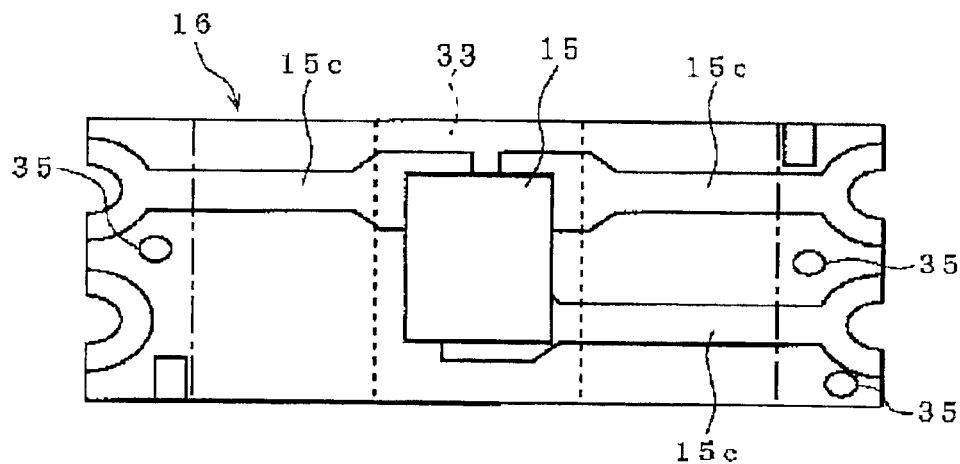

Then, as illustrated in FIG. 7D, each of the flexible printed circuits 16 is downwardly bent at the first lines 16a, as having been explained with reference to FIG. 6D.

Figure 7E:
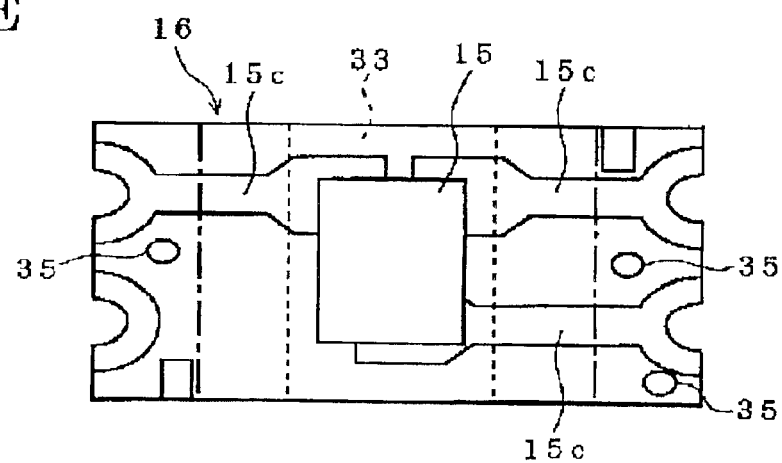

Then, as illustrated in FIG. 7E, each of the flexible printed circuits 16 is upwardly bent at the second lines 16b, as having been explained with reference to FIG. 6E.

Then, each of the flexible printed circuits 16 is fixed at their opposite ends onto the first signal processing circuit substrate 13.

As mentioned so far, the flexible printed circuit 16 is fixed on the first signal processing circuit substrate 13 such that the resistance adjustment portion 15a of the variable resistor 15 is exposed through the rectangular through-hole 31 when observed from the lower surface 13b of the first signal processing circuit substrate 13. Hence, an operator could readily insert an adjuster such as a screwdriver through the through-hole 31 from the lower surface 13b, and adjust the resistance adjustment portion 15a. Accordingly, an operator could adjust a resistance of the variable resistor 15 by rotating the resistance adjustment portion 15a to optimally adjust a supplied voltage as looking at a display screen of the liquid crystal module 17.

For instance, the flexible printed circuit 16 is comprised preferably of the following components, taking into consideration that the flexible printed circuit 16 preferably has a thickness and is composed of a material such that the flexible printed circuit 16 can be folded by a short length and can be resistive to a stress exerted thereon when the variable resistor 15 is adjusted:

about 18 micrometers of a silver foil;
about 12.5 micrometers of a base film;
about 12.5 micrometers of a cover film; and
about 0.3 mm of a reinforcing plate.

Since the flexible printed circuit 16 is flexible enough to absorb a stress exerted thereon when the variable resistor 15 is adjusted, it would be possible to prevent such a stress from being applied directly to the back-light unit 18. As a result, it would be possible to prevent the variable resistor 15 from being damaged, and further prevent degradation in display quality in a liquid crystal display unit including the signal processing circuit substrate in accordance with the embodiment.

A variable resistor including a resistance adjustment portion at one of its upper and lower surfaces is generally lower in height than a variable resistor including a resistor adjustment portion at its upper and lower surfaces. In accordance with the embodiment, it would be possible to use the former, ensuring reduction in a thickness of a liquid crystal panel including the signal processing circuit substrate in accordance with the embodiment.

Since the variable resistor 15 is mounted on the first signal processing circuit substrate 13 through the flexible printed circuit 16 fixed to the first signal processing circuit substrate 13 through the solders 32a to 32d, a stress exerted on the variable resistor 15 is leveled by the flexibility of the flexible printed circuit 16, preventing the variable resistor 15 from being damaged and the flexible printed circuit from being torn off.

In accordance with the embodiment, if the first signal processing circuit substrate 13 were varied in design, it would not be necessary to prepare a variable resistor conforming to the varied signal processing circuit substrate. Merely by varying the copper pattern 36a of the flexible printed circuit sheet 36, the variable resistor 15 can be mounted on the varied signal processing circuit substrate. Thus, the signal processing circuit substrate 13 could have enhanced designability.

The reinforcing plate 33 enhances adjustability of the resistance adjustment portion 15a, and prevents the flexible printed circuit 16 from being damaged. When adjusted, a stress including a compressive force and a rotational moment unavoidably exerts on the variable resistor 15. The reinforcing plate 33 uniformly distributes such a stress.

The reinforcing pads 34a and 34b prevents the flexible printed circuit 16 from being peeled off the signal processing circuit substrate 13, and further distributes a compressive force and a rotational force exerted on the flexible printed circuit 16 when the resistance adjustment portion 15a is rotated by a screwdriver.

Since the resistance adjustment portion 15a enters the through-hole 31, a part of a height of the variable resistor 15 is absorbed into a thickness of the signal processing circuit substrate 13, ensuring reduction in a height of the variable resistor 15 when mounted on the signal processing circuit substrate 13.

A final bar to reduction in a thickness of a liquid crystal panel was a variable resistor. Since the above-mentioned embodiment can reduce a height of a variable resistor, it would be possible to reduce a thickness of a liquid crystal panel.

In addition, since the variable resistor 15 does not project beyond the signal processing circuit substrate 13, it would be possible to prevent the variable resistor 15 from being damaged due to collision with another parts and from being short-circuited due to electrical contact with another parts.

Furthermore, since the variable resistor 15 is supported by the flexible printed circuit 16 in a floating condition relative to the signal processing circuit substrate 13, it is not necessary to form a mount on the signal processing circuit substrate for supporting the variable resistor 15 therewith. This ensures the signal processing circuit substrate to be flat without a projection.

Figure 8:
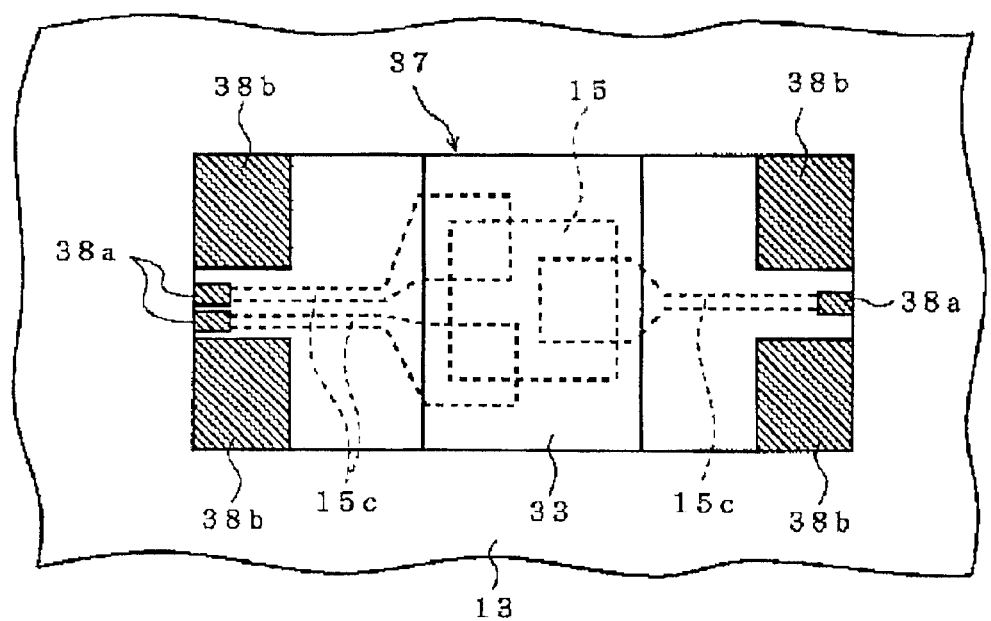
FIG. 8 is a plan view of a signal processing circuit substrate on which a variable resistor is mounted by means of another flexible printed circuit.

FIG. 8 is a plan view of a signal processing circuit substrate on which a variable resistor is mounted through another flexible printed circuit 37.

As illustrated in FIG. 8, the copper pattern 36a into which the flexible printed circuit sheet 36 is patterned is comprised of an electrical mount portion 38a and a mechanical mount portion 38b. The electrical mount portion 38a is designed to meet a function of electrical connection, and the mechanical mount portion 38b is designed to meet a function of mechanical connection. The electrical mount portion 38a merely presents electrical conductivity, and the mechanical mount portion 38b has a broader area than an area of the electrical mount portion 38a so as to provide a strength against rotational and compressive forces.

It is not always necessary to form the reinforcing pads 34a and 34b in the flexible printed circuit 37 illustrated in FIG. 8, however, mechanical connection could be enhanced by forming the reinforcing pads 34a and 34b.

Figure 9A:
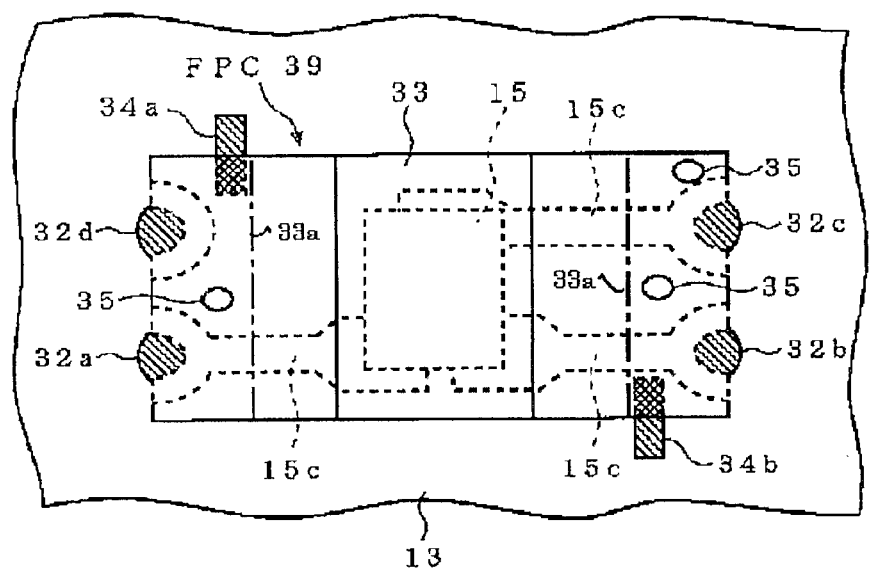
FIG. 9A is a plan view of a signal processing circuit substrate on which a variable resistor is mounted by means of another flexible printed circuit.

FIG. 9A is a plan view of a signal processing circuit substrate on which a variable resistor is mounted through still another flexible printed circuit 39.

In comparison with the flexible printed circuit 16 illustrated in FIGS. 5A to 5C, the reinforcing pads 34a and 34b are positioned in a different location. In the flexible printed circuit 39, the reinforcing pads 34a and 34b are positioned between first lines 33a and the opposite ends of the flexible printed circuit 39 and just adjacent to the first lines 33a. Herein, the first lines 33a are similar to the first lines 16a illustrated in FIG. 6D at which the flexible printed circuit 39 is downwardly bent.

The flexible printed circuit 39 could be prevented from peeling off the first signal processing circuit substrate 13 due to the reinforcing pads 34a and 34b more certainly than the flexible printed circuit 33, and could have a greater strength against rotational and compressive forces than the flexible printed circuit 33 illustrated in FIGS. 5A to 5C.

In addition, an area occupied by the reinforcing pads 34a and 34b illustrated in FIG. 9A remain the same as an area occupied by the reinforcing pads 34a and 34b illustrated in FIGS. 5A to 5C.

Figure 9B:
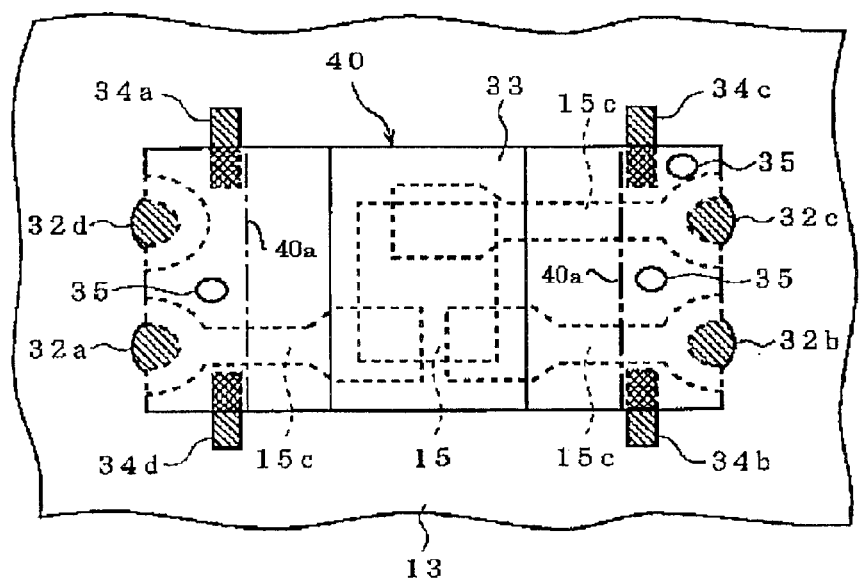
FIG. 9B is a plan view of a signal processing circuit substrate on which a variable resistor is mounted by means of still another flexible printed circuit.

FIG. 9B is a plan view of a signal processing circuit substrate on which a variable resistor is mounted through yet another flexible printed circuit 40.

The illustrated flexible printed circuit 40 has four reinforcing pads 34a, 34b, 34c and 34d located in symmetry about a center of the variable resistor 15. In the flexible printed circuit 40, the reinforcing pads 34a to 34d are positioned between first lines 40a and the opposite ends of the flexible printed circuit 40 and just adjacent to the first lines 40a. Herein, the first lines 40a are similar to the first lines 16a illustrated in FIG. 6D at which the flexible printed circuit 40 is downwardly bent.

The flexible printed circuit 40 could be prevented from peeling off the first signal processing circuit substrate 13 due to the reinforcing pads 34a to 34d more certainly than the flexible printed circuit 39 illustrated in FIG. 9A, and could have a greater strength against rotational and compressive forces than the flexible printed circuit 39 illustrated in FIG. 9A.

In the above-mentioned embodiments, the variable resistor 15 is explained as a device to be mounted on the signal processing circuit substrate 13. However, the above-mentioned embodiments can be applied to other devices having a similar structure to the variable resistor 15, such as a variable capacitor or a laser trimming resistor.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2000-64532 filed on Mar. 9, 2000 including specification, claims, drawings and summary is incorporated herein by reference in its entirety.

What is claimed is:

1. A signal processing circuit substrate assembly used for a liquid crystal display unit, comprising:

a signal processing circuit substrate a signal processing circuit substrate configured to drive a liquid crystal display unit;

a through-hole formed through said signal processing circuit substrate;

a mounting member positioned opposite said through-hole and electrically connected at an edge thereof to the first surface of said signal processing circuit substrate; and a device electrically and mechanically mounted on a first surface of said mounting member, said device having a variable value and including a value adjustment portion through which said variable value is adjusted, said value adjustment portion facing said through-hole.

2. The signal processing circuit substrate assembly as set forth in claim 1, wherein said mounting member is comprised of a flexible printed circuit electrically connecting the edge of the mounting member to the first surface of said signal processing circuit substrate at a region proximate the through-hole.

3. The signal processing circuit substrate assembly as set forth in claim 1, wherein said mounting member is composed of flexible material electrically connecting opposite edges of the mounting member to said first surface of said signal processing circuit substrate, and said device is supported by said mounting member in a displaceable floating condition above said signal processing circuit substrate.

4. The signal processing circuit substrate assembly as set forth in claim 1, wherein said mounting member is fixed at one corner thereof onto said first surface of said signal processing circuit substrate and fixed together with terminals of said device at three corners thereof onto said first surface of said signal processing circuit substrate.

5. The signal processing circuit substrate assembly as set forth in claim 1, wherein said device is mounted on said mounting member such that said value adjustment portion does not project beyond a second surface of said signal processing circuit substrate.

6. The signal processing circuit substrate assembly as set forth in claim 1, wherein said through-hole has such an area that an adjuster used for adjusting said value adjustment portion can move sufficiently to be engaged with said value adjustment portion through said through-hole.

7. The signal processing circuit substrate assembly as set forth in claim 6, wherein said area is equal to a sum of a first area actually occupied by said device and a second area in which said device is allowed to move.

8. The signal processing circuit substrate assembly as set forth in claim 1, said mounting member further comprises a plate for reinforcing said mounting member, which plate absorbs a compressive force exerted on said mounting member when said value adjustment portion is adjusted.

9. The signal processing circuit substrate assembly as set forth in claim 8, wherein said plate is fixed onto said mounting member at the opposite side of said device.

10. The signal processing circuit substrate assembly as set forth in claim 1, further comprising a plurality of reinforcing pads which fix said mounting member onto said first surface of said signal processing circuit substrate.

11. The signal processing circuit substrate assembly as set forth in claim 10, wherein said signal processing circuit substrate includes at least two reinforcing pads which are located on a diagonal line passing through a center of said mounting member.

12. The signal processing circuit substrate assembly as set forth in claim 1, wherein said mounting member is formed with means for preventing said mounting member from being wrongly fixed onto said signal processing circuit substrate.

13. The signal processing circuit substrate assembly as set forth in claim 12, wherein said means is comprised of three holes which are located in no rotational symmetry about a center of said mounting member.

14. The signal processing circuit substrate assembly as set forth in claim 12, wherein said means is comprised of three projections which are located in no rotational symmetry about a center of said mounting member.

15. The signal processing circuit substrate assembly as set forth in claim 12, wherein said means is comprised of three marks which are located in no rotational symmetry about a center of said mounting member.

16. The signal processing circuit substrate assembly as set forth in claim 1, wherein said mounting member is fixed onto said first surface of said signal processing circuit substrate by any one or more of soldering, application of an adhesive, screwing and welding.

17. The signal processing circuit substrate assembly as set forth in claim 1, wherein said device is a resistor.

18. The signal processing circuit substrate assembly as set forth in claim 1, wherein said device is a capacitor.

19. The signal processing circuit substrate assembly as set forth in claim 1, wherein said device is a laser trimming resistor.

20. A signal processing circuit substrate assembly used for a liquid crystal display unit, comprising:
a signal processing circuit substrate liquid crystal display unit;
a through-hole formed through said signal processing circuit substrate;
a device being mounted on a first surface of said signal processing circuit substrate, said device having a variable value and including a value adjustment portion through which said variable value is adjusted; and
said signal processing circuit substrate including a flexible arch-shaped member having a height relative to said first surface of said signal processing circuit substrate,
said device being electrically and mechanically fixed onto a lower surface of said member in a displaceable floating condition above said signal processing circuit substrate such that said value adjustment portion is in alignment with said through-hole so as to allow said value adjustment portion to be adjusted through said through-hole,
said member being fixed at opposite edges onto said first surface of said signal processing circuit substrate.

21. The signal processing circuit substrate assembly as set forth in claim 20, wherein said member is comprised of a flexible printed circuit.

22. The signal processing circuit substrate assembly as set forth in claim 20, wherein said member is fixed at one corner thereof onto said first surface of said signal processing circuit substrate and fixed together with terminals of said device at three corners thereof onto said first surface of said signal processing circuit substrate.

23. The signal processing circuit substrate assembly as set forth in claim 20, wherein said device is mounted on said member such that said value adjustment portion does not project beyond a second surface of said signal processing circuit substrate.

24. The signal processing circuit substrate assembly as set forth in claim 20, wherein said through-hole has such an area that an adjuster used for adjusting said value adjustment portion can move sufficiently to be engaged with said value adjustment portion through said through-hole.

25. The signal processing circuit substrate assembly as set forth in claim 24, wherein said area is equal to a sum of a first area actually occupied by said device and a second area in which said device is allowed to move.

26. The signal processing circuit substrate assembly as set forth in claim 20, wherein said member further comprises a plate for reinforcing said member, which plate absorbs a compressive force exerted on said member when said value adjustment portion is adjusted.

27. The signal processing circuit substrate assembly as set forth in claim 26, wherein said plate is fixed onto said member at the opposite side of said device.

28. The signal processing circuit substrate assembly as set forth in claim 20, further comprising a plurality of reinforcing pads which fix said member onto said first surface of said signal processing circuit substrate.

29. The signal processing circuit substrate assembly as set forth in claim 28, wherein said signal processing circuit substrate includes at least two reinforcing pads which are located on a diagonal line passing through a center of said member.

30. The signal processing circuit substrate assembly as set forth in claim 28, wherein said reinforcing pads are located adjacent to a bending of said member.

31. The signal processing circuit substrate assembly as set forth in claim 28, wherein said signal processing circuit substrate includes four reinforcing pads located in a rotational symmetry about a center of said member and adjacent to a bending of said member.

32. The signal processing circuit substrate assembly as set forth in claim 20, wherein said member is formed with means for preventing said member from being wrongly fixed onto said signal processing circuit substrate.

33. The signal processing circuit substrate assembly as set forth in claim 32, wherein said means is comprised of three holes which are located in no rotational symmetry about a center of said member.

34. The signal processing circuit substrate assembly as set forth in claim 32, wherein said means is comprised of three projections which are located in no rotational symmetry about a center of said member.

35. The signal processing circuit substrate assembly as set forth in claim 32, wherein said means is comprised of three marks which are located in no rotational symmetry about a center of said member.

36. The signal processing circuit substrate assembly as set forth in claim 20, wherein said member is fixed onto said first surface of said signal processing circuit substrate by any one or more of soldering, application of an adhesive, screwing and welding.

37. The signal processing circuit substrate assembly as set forth in claim 20, wherein said device is a resistor.

38. The signal processing circuit substrate assembly as set forth in claim 20, wherein said device is a capacitor.

39. The signal processing circuit substrate assembly as set forth in claim 20, wherein said device is a laser trimming resistor.

40. A method of fabricating a signal processing circuit substrate assembly used for a liquid crystal display unit, a device being mounted on a first surface of said signal processing circuit substrate, said device having a variable value and including a value adjustment portion through which said variable value is adjusted, said method comprising the sequential steps of:
(a) mounting said device onto an upper surface of a flexible member such that said value adjustment portion upwardly faces;
(b) bending said flexible member at first lines thereof towards a lower surface of said flexible member;
(c) bending said flexible member at second lines towards said upper surface, said second lines being located between said device and said first lines; and
(d) fixing said flexible member at its opposite ends onto said first surface of said signal processing circuit substrate a signal processing circuit substrate configured to drive a liquid crystal display unit, such that said value adjustment portion is exposed through a through-hole formed through said signal processing circuit substrate, wherein,
the method steps produce a signal processing circuit substrate for a liquid crystal display unit with the variable value device mounted on the first surface of said signal processing circuit substrate.

41. The method as set forth in claim 40, further comprising the step of (e) fixing a reinforcing plate onto a lower surface of said flexible member, said step (e) being carried out before said step (d).

42. The method as set forth in claim 40, wherein said flexible member is fixed at one corner thereof onto said first surface of said signal processing circuit substrate assembly and fixed together with terminals of said device at three corners thereof onto said first surface of said signal processing circuit substrate in said step (d).

43. The method as set forth in claim 40, wherein said flexible member is fixed onto said first surface of said signal processing circuit substrate assembly such that said value adjustment portion does not project beyond a second surface of said signal processing circuit substrate.

44. The method as set forth in claim 40, further comprising the step of (f) fixing said flexible member onto said first surface of said signal processing circuit substrate assembly with a plurality of reinforcing pads.

45. The method as set forth in claim 44, wherein at least two reinforcing pads are located on a diagonal line passing through a center of said member, in said step (f).

46. The method as set forth in claim 44, wherein, four reinforcing pads are located in a rotational symmetry about a center of said member and adjacent to a bending of said flexible member, in said step (f).

47. A method of fabricating a signal processing circuit substrate assembly used for a liquid crystal display unit, a device being mounted on a first surface of said signal processing circuit substrate, said device having a variable value and including a value adjustment portion through which said variable value is adjusted, said method comprising the sequential steps of:
(a) patterning a flexible printed circuit sheet into patterns which will make flexible printed circuits;
(b) covering said flexible printed circuit sheet with an electrical insulator;
(c) mounting said device on a second surface of said flexible printed circuit sheet;
(d) cutting said flexible printed circuit sheet into flexible printed circuits;
(e) downwardly bending said flexible printed circuit sheet at first lines across said device;
(f) upwardly bending said flexible printed circuit sheet at second lines across said device, said second lines being located between said device and said first lines; and
(g) fixing said flexible printed circuit sheet onto said first surface of said signal processing circuit substrate a signal processing circuit substrate configured to drive a liquid crystal display unit, such that said value adjustment portion of said device is in alignment with a through-hole formed throughout said signal processing circuit substrate.

48. The method as set forth in claim 47, further comprising the step of (h) adhering a reinforcing plate on a first surface of said flexible printed circuit sheet across a width of said flexible printed circuit sheet, said step (h) being carried out prior to said step (d).

49. The method as set forth in claim 47, further comprising the step of (i) forming marks located in no rotational symmetry about a center of said printed circuit sheet.

50. The method as set forth in claim 49, wherein said marks are comprised of holes, and said step (i) is carried out concurrently with said step (d).

51. The method as set forth in claim 47, wherein said flexible printed circuit is fixed onto said first surface of said signal processing circuit substrate assembly such that said value adjustment portion does not project beyond a second surface of said signal processing circuit substrate.

52. The method as set forth in claim 47, further comprising the step of fixing said flexible printed circuit onto said first surface of said signal processing circuit substrate assembly with a plurality of reinforcing pads.

53. The method as set forth in claim 52, wherein at least two reinforcing pads are located on a diagonal line passing through a center of said flexible printed circuit.

54. The method as set forth in claim 47, wherein four reinforcing pads are located in a rotational symmetry about a center of said flexible printed circuit and adjacent to said second lines of said flexible printed circuit.

* * * * *